United States Patent
Fang et al.

(10) Patent No.: US 10,114,042 B2
(45) Date of Patent: Oct. 30, 2018

(54) VERTICAL PROBE CARD

(71) Applicant: Texas Instruments Incorporated, Dallas, TX (US)

(72) Inventors: Ming Fang, Plano, TX (US); Faheem Mohamedi, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 26 days.

(21) Appl. No.: 15/016,745

(22) Filed: Feb. 5, 2016

(65) Prior Publication Data

US 2017/0227580 A1    Aug. 10, 2017

(51) Int. Cl.
G01R 31/00    (2006.01)
G01R 1/073    (2006.01)
G01R 1/067    (2006.01)

(52) U.S. Cl.
CPC ..... G01R 1/07314 (2013.01); G01R 1/06727 (2013.01); G01R 1/07364 (2013.01)

(58) Field of Classification Search
CPC .... G01R 3/00; G01R 1/0466; G01R 1/06727; G01R 1/06738; G01R 1/06744; G01R 1/06761; G01R 1/06766; G01R 1/06772; G01R 1/07342; G01R 1/0735; G01R 1/07357; G01R 1/0408; G01R 1/067; G01R 1/06716; G01R 31/2601; G01R 31/2889; G01R 31/2891; G01R 1/06733; G06F 17/5068

See application file for complete search history.

(56) References Cited

U.S. PATENT DOCUMENTS

| | | | |
|---|---|---|---|
| 6,211,685 B1 * | 4/2001 | Stanford | G01R 1/071 324/716 |
| 6,441,315 B1 | 8/2002 | Eldridge et al. | |
| 6,672,876 B1 * | 1/2004 | Takekoshi | H01R 13/2407 439/66 |
| 7,005,751 B2 * | 2/2006 | Khandros | H01L 24/72 257/773 |
| 8,203,353 B2 * | 6/2012 | Kister | G01R 1/06733 324/754.11 |
| 2014/0327461 A1 | 11/2014 | Fan et al. | |

* cited by examiner

Primary Examiner — Vinh Nguyen
(74) Attorney, Agent, or Firm — Kenneth Liu; Charles A. Brill; Frank D. Cimino

(57) ABSTRACT

A probe for a vertical probe card includes an unsupported base portion that extends from the vertical probe card, a cantilevered portion that extends substantially perpendicular to the unsupported base portion and a contact portion that includes a tip. The cantilevered portion has a first thickness at an end adjacent the unsupported base portion and a second thickness at an end adjacent the contact portion, the second thickness being less than the first thickness.

17 Claims, 3 Drawing Sheets

FIG. 2C

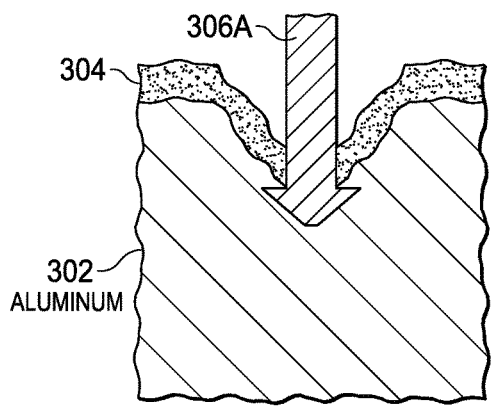
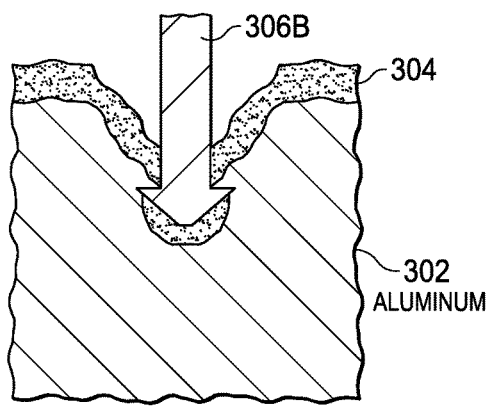
FIG. 3A
FIG. 3B
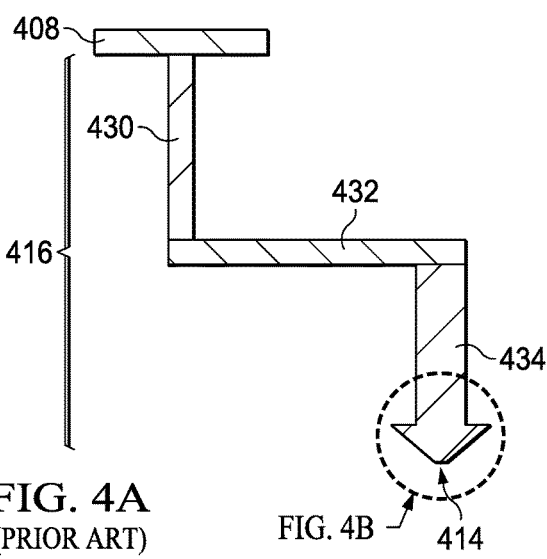
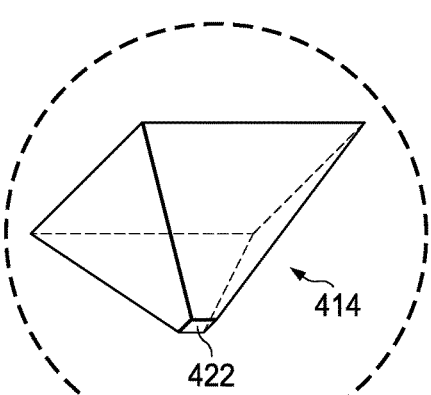
FIG. 4A
(PRIOR ART)
FIG. 4B
(PRIOR ART)

VERTICAL PROBE CARD

FIELD OF THE DISCLOSURE

Disclosed embodiments relate generally to the field of electronic device testing. More particularly, and not by way of any limitation, the present disclosure is directed to a vertical probe card and elements thereof.

BACKGROUND

Probe cards are devices that can provide an interface between a tester for controlling testing of an electronic device and the electronic device. It is desirable to minimize contact resistance between the contacting elements of the probe card and a Device under Test (DUT) in order to maintain reliable testing and optimal throughput. As devices become smaller and smaller, establishing good contact with the DUT becomes increasingly difficult.

SUMMARY

The present patent application discloses modifications to the design of the probes and tips used in vertical probe cards. These modifications, both individually and collectively, allow the probe to better break through to clean metal in the contacts, thus improving contact resistance. The modifications include a shortened, re-enforced cantilevered portion of the probe, an elongated axe-head shape on the tip, and a surface alloy that hardens the tip.

In one aspect, an embodiment of a probe for a vertical probe card is disclosed. The probe includes an unsupported base portion that extends from the vertical probe card; a cantilevered portion that extends substantially perpendicular to the unsupported base portion; and a contact portion that includes a tip; wherein the cantilevered portion has a first thickness at an end adjacent the unsupported base portion and a second thickness at an end adjacent the contact portion, the second thickness being less than the first thickness.

In another aspect, an embodiment of a probe tip for a vertical probe card is disclosed. The probe tip includes a cutting edge having a length and a width; trapezoidal sides extending at an angle from the cutting edge; and a surface alloy covering at least a portion of the cutting edge and the trapezoidal sides.

In yet another aspect, an embodiment of a vertical probe card is disclosed. The vertical probe card includes a carrier comprising a probe guide that extends therethrough; and a probe disposed in the probe guide and connected to provide an electrical path between a device under test and a test controller, the probe comprising an unsupported base portion that extends from the carrier, a cantilevered portion that extends substantially perpendicular to the unsupported base portion, and a contact portion that includes a tip; wherein the cantilevered portion has a first thickness at an end adjacent the unsupported base portion and a second thickness at an end adjacent the contact portion, the second thickness being less than the first thickness.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 3A and 3B depict a probe tip penetrating the surface of an aluminum contact using a stiff arm and a hard probe tip versus using a softer arm and soft probe tip;

FIG. 4A depicts a section of a vertical probe card and probe as known in the art; and FIG. 4B depicts a perspective detail view of the tip of the probe in FIG. 4A as known in the art.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As integrated circuits are built smaller and smaller, the test pads also get smaller. The small pad opening poses both process and test challenges. After metallization layers are deposited, a passivation layer is deposited and then etched to expose desired portions, such as the test pads. Although every effort is made to clean the tests pads well, this can be difficult. For small pad openings (e.g., 40×40 µm), polymer byproducts of the etching/cleaning processes can be left on the test pads. Even if the test pads are free of this type of debris, natural oxidation of the aluminum leaves an oxidation layer that must be pierced in order to contact fresh aluminum and obtain reliable test results.

With larger aluminum pads (e.g., 60×60 µm), tungsten cantilever probe cards work relatively well and can maintain about 0.5Ω per contact. Cantilever probes are designed to contact the test pad and then scrape across the pad to expose fresh aluminum. However, cantilever cards don't work well with small pads, which lack the room for effective scraping of the surface, and yield unstable contact resistance. Minimizing contact resistance requires continuing improvements, as maintaining low contact resistance is key to smooth and reliable production.

Figure 1:
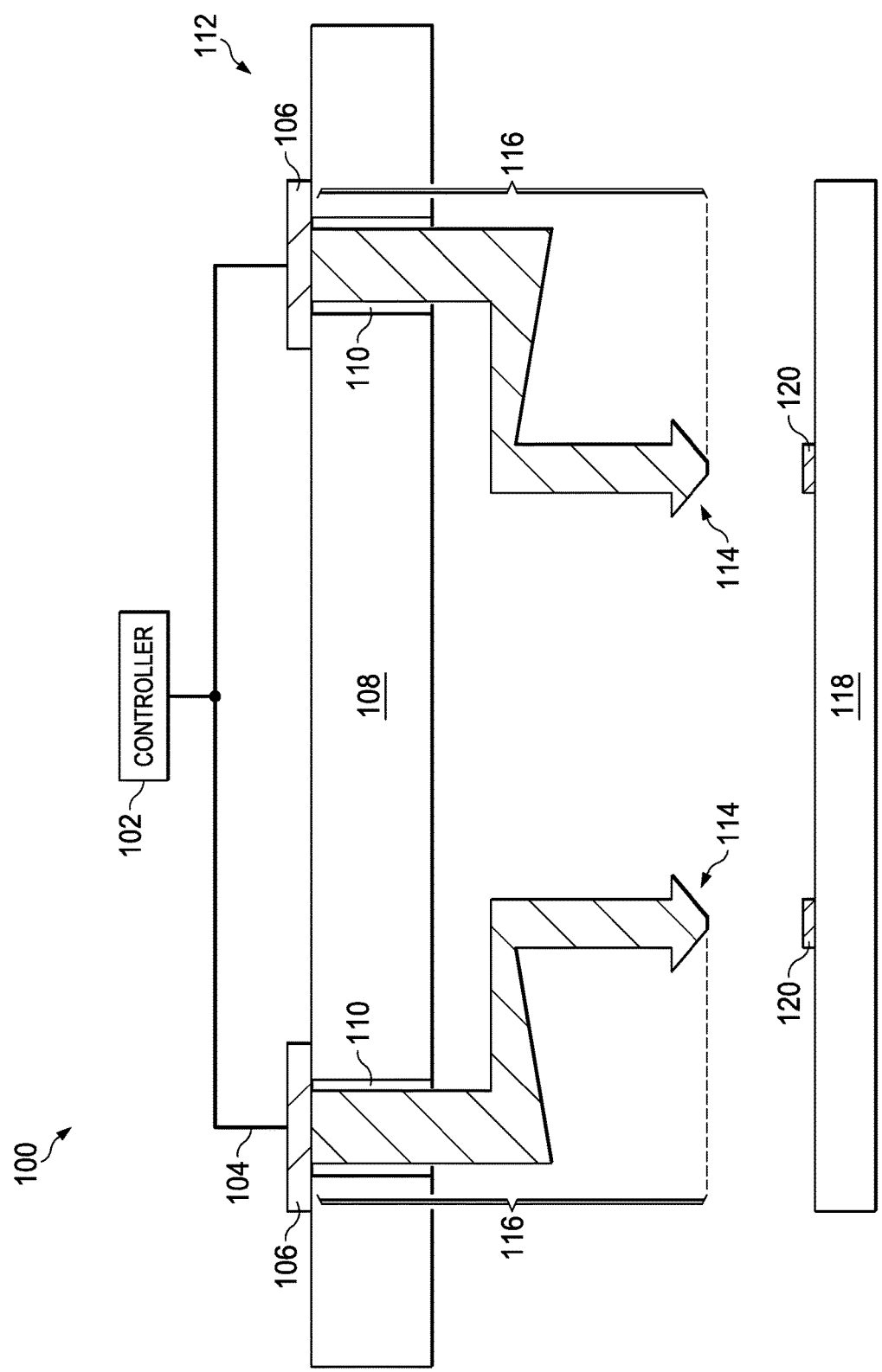
FIG. 1 illustrates a test system containing a probe card containing probes according to an embodiment of the disclosure.

FIG. 1 discloses a cross-sectional view of an example test system 100 for testing DUT 118. DUT 118 can include a semiconductor wafer comprising unsingulated dies, singulated semiconductor dies, and other electronic devices. The system 100 can comprise test Controller 102, Probe Card 112, and Communications Channels 104 connecting Probe Card 112 to Controller 102. As shown, Probe Card 112 includes Carrier 108, which contains electrical Contacts 106 for connection to Controller 102 via Communication Channels 104. Carrier 108 can include Probe Guides 110, each of which can comprise one or more passages, openings, and/or features in or through Carrier 108. Probes 116 can be attached to Carrier 108 by inserting Probes 116 into one of Probe Guides 110.

As shown, each Probe 116 can comprise a Tip 114 for contacting Terminal 120 of DUT 118 and can further contact electrical Contact 106, either directly or indirectly through intermediate conductive paths. When Tips 114 of Probes 116 are brought into contact with Terminals 120 of DUT 118, Probe 116 thus forms part of an electrically conductive path between DUT 118 and Controller 102. Controller 102 can then control testing of DUT 118 by providing test signals through the Communications Channels 104 and Probe Card 112 to the DUT, and Tester 102 can likewise receive response signals from DUT 118 through Probe Card 112 and Channels 104. Alternatively, part or all of Controller 102 can be located on the Probe Card 112. One skilled in the art will realize that the description of a vertical probe card is simplified for purposes of this disclosure. A vertical probe card can contain other elements not specifically shown, so long as the probe card operates to provide an electrical path between the contacts of the DUT and a test controller.

Turning next to FIG. 4A, Structure 400 discloses a view of a portion of Probe 416 that extends from Carrier 408 as known in the art. As seen in this figure, Probe 416 includes three sections: Unsupported Base Portion 430, Cantilevered Portion 432, which extends substantially perpendicular to the unsupported base portion, and Contact Portion 434, which includes Tip 414. Probe 416 is formed of a conductive material, using photolithographic techniques, such that a precisely-shaped probe is formed to carry an electrical signal from the DUT to testing equipment. Probe 416 and Tip 414 may be formed separately and attached or formed as a single structure. Materials used to make Probe 416 and Tip 414 include, but are not limited to, palladium, gold, rhodium, nickel, cobalt, silver, platinum, conductive nitrides, conductive carbides, tungsten, titanium, molybdenum, rhenium, indium, osmium, copper, refractory metals, and their combinations and alloys. Additionally, Probe 416 and Tip 414 can be made of the same material or different materials.

As seen in FIG. 4B, which provides a perspective detail view of the tip, Tip 414 is generally shaped like a somewhat truncated pyramid, i.e., Contact Surface 422 has four substantially equal sides, with four trapezoidal sides extending at an angle therefrom. This structure can provide relatively smooth testing with contact resistance (CRES) in the range of about 2-5 Ω/contact. However, Applicants have at times observed a large contact resistance, resulting in unnecessary re-probes and adding a burden to the testing process.

Applicants have found that two factors determine CRES—the hardness of the tip and the stiffness of the probe. As seen in FIGS. 3A and 3B, Aluminum Contact 302 may have Contaminants 304, formed of various types of debris and/or oxides, covering the surface. Contaminants 304 must be broken through in order to establish a reliable contact with clean aluminum. When a stiff arm and a hard probe tip are used, as shown in FIG. 3A, Probe Tip 306A will break into the surface of Aluminum Contact 302 to contact pure aluminum with abrupt tearing force. On the other hand, when a soft spring arm and a soft probe tip are used, as shown in FIG. 3B, Tip 306B will break into the surface of Aluminum Contact 302 with blunter force. This blunt force will press Contaminants 304 into Aluminum Contact 302, resulting in higher CRES and can also leave contaminants on Tip 306B.

Figure 2A:
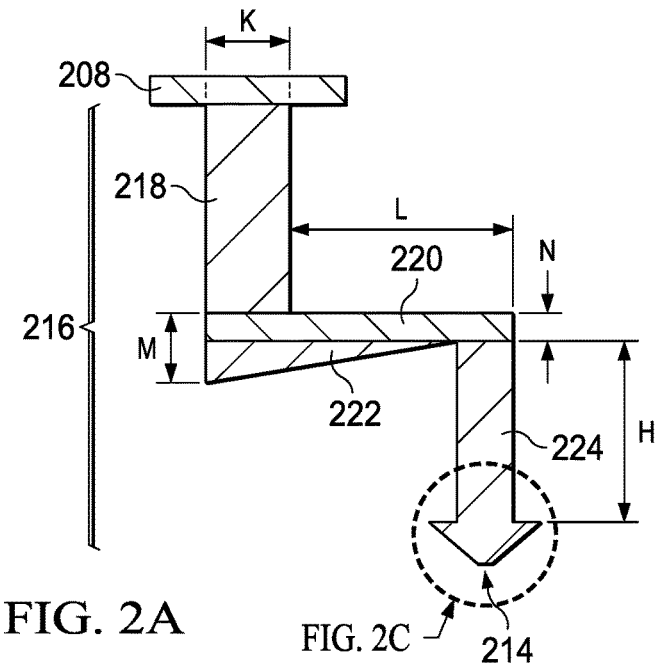
FIG. 2A depicts a section of a vertical probe card and probe according to an embodiment of the disclosure.

FIG. 2A discloses Structure 200, which includes the portion of Probe 216 that extends from Carrier 208 according to an embodiment of the disclosure. Probe 216 is again formed of basically three sections: Unsupported Base Portion 218, which extends from Carrier 208, Cantilevered Portion 220, which extends substantially perpendicular to Unsupported Base Portion 218, and Contact Portion 224, which includes Tip 214. It will be understood that Unsupported Base Portion 218 extends into Carrier 208 as a base portion (not specifically shown) that is supported (i.e., held) by Carrier 208. Descriptions of Unsupported Base Portion 218 do not provide any limitations on those portions of Probe 212 that extend into Carrier 208. Portions of the base of Probe 216 that are held in Carrier 208 can be simple elongations of Unsupported Base Portion 218, similar to the illustration in FIG. 1, or can be modified in any manner necessary or desirable to fulfill the function of Probe 216.

Figure 2B:
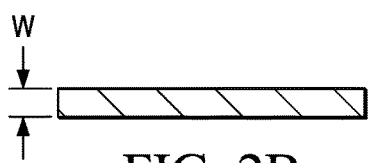
FIG. 2B depicts a perspective detail view of the tip of the vertical probe of FIG. 2A according to an embodiment of the disclosure.
Figure 2C:
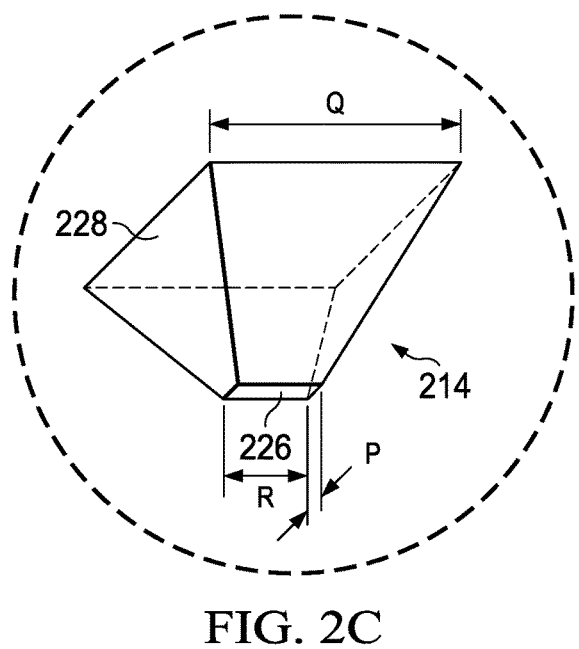
FIG. 2C depicts a top view of the cantilevered portion of the vertical probe of FIG. 2A according to an embodiment of the disclosure.

As seen in this figure, Cantilevered Portion 220 is supported by Section 222 to add stiffness. Cantilevered Portion 220 and Section 222 are shown as two separate elements to emphasize differences from the known art, although Cantilevered Portion 220 and Section 222 can be integrally formed. For the discussion of FIG. 2, Cantilevered Portion 220 and Section 222 will be discussed as simply Cantilevered Portion 220. Cantilevered Portion 220 has a first thickness M at the end where Unsupported Base Section 218 and Cantilevered Portion 220 meet and has a second thickness N at the opposite end. This added support provides additional stiffness to aid in providing an abrupt tearing force on contact. As seen in FIG. 2B, which depicts a top view of Cantilevered Portion 220, this section has a constant width W throughout.

Because the specific applications in which Probe 216 is used can affect the overall size of Probe 216, specific measurements are not given, although ranges in the relationship between different parts of Probe 216 are provided. In at least one embodiment, the value of N/M is between 0.4 and 0.7. Additionally, in at least one embodiment, the thickness K of Unsupported Base Portion 218 divided by M is between 0.9 and 1.5. Length L of Cantilevered Portion 220, which is measured from Unsupported Base Portion 218 to the opposite end and is thus the unsupported portion of Cantilevered Portion 220, can also affect the stiffness of Probe 216. In at least one embodiment, length L divided by width W of Cantilevered Portion 220 is in the range of 13-17 and length L divided by height H of Contact Portion 224 is in a range between 25 and 100. Each of these relationships can contribute to the desired stiffness of Probe 216.

FIG. 2B depicts a perspective detail view of Tip 214. Applicants have discovered that an elongated Tip 214, which is shaped more like an axe blade, can provide better contact with test pads. In the disclosed embodiment, Tip 214 has a Contact Surface 226, which initially contacts a test pad, and four trapezoidal sides extending at an angle therefrom. Contact Surface 226 has a length of R and a width of P. Trapezoidal Surface 228 has two substantially parallel sides, with the smaller side having a width P and the larger side having a width Q. In at least one embodiment, the value of Q/P is greater than 5. In at least one embodiment, the value of R/P is greater than 2. Having an elongated Tip 214 can both support the achievement of an abrupt tearing force on contact with the aluminum and also provide a larger contact surface.

As noted earlier, another way to provide an abrupt tearing force on contact with the contact points on a DUT is to provide a harder surface on Tip 214. In at least one embodiment, a low temperature metal alloy process is used to coat Tip 214 with a thin layer that increases the hardness and stiffness of the tip. In at least one embodiment, titanium nitride (TiN), which has hardness of 9, is used as a coating on Tip 214. Other coatings can be used, including but not limited to titanium aluminum nitride (TiAlN) and chromium nitride (CrN).

Each of the modifications noted above can act either singly or in concert with the other disclosed modifications to improve contact with a DUT. Various embodiments of the disclosure can provide one or more of the following advantages: reduced contact resistance, enhanced test reliability that results in more efficient testing, and a low CRES that is competitive with tungsten cantilever probes. The disclosed embodiments can also be used in RF testing, where impedance is very sensitive to probe pressure.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A probe for a vertical probe card, the probe comprising:
    an unsupported base portion that extends from the vertical probe card;
    a contact portion that includes a tip; and
    a cantilevered portion that extends between the unsupported base portion and the contact portion and is connected to the unsupported base portion and to the contact portion, the cantilevered portion having a first end, a second end opposite the first end, a top surface that extends from the first end to second end, and a bottom surface that extends from the first end to the second end, the bottom surface being opposite the top surface and the top surface defining a length of the cantilevered portion;
    wherein the unsupported base portion has a lower end that is connected to a portion of the top surface of the cantilevered portion and an upper end opposite the lower end, the unsupported base portion extending away from the top surface of the cantilevered portion so that the upper end of the unsupported base portion is located at a first height, and the lower end is connected to the portion of the top surface at a first position along the length of the cantilevered portion, the first position being adjacent the first end;
    wherein the contact portion has an upper end opposite the tip, and the upper end of the contact portion is connected to a portion of the bottom surface of the cantilevered portion at a second position along the length of the cantilevered portion, the second position being adjacent the second end; and
    wherein the cantilevered portion has a first thickness at the first end and a second thickness at the second end, the second thickness being less than the first thickness, and wherein a first distance between the first height and the bottom surface when measured at the first position is greater than a second distance between the first height and the bottom surface when measured at the second position.

2. The probe as recited in claim 1, wherein the second thickness divided by the first thickness is less than or equal to 0.7.

3. The probe as recited in claim 2, wherein the cantilevered portion has an unsupported length defined by the top surface less the portion of the top surface connected to the unsupported base portion, wherein the unsupported length of the cantilevered portion divided by the width of the cantilevered portion at the second end is equal to or less than 17.

4. The probe as recited in claim 3, wherein the unsupported length of the cantilevered portion divided by the width of the cantilevered portion at the second end is equal to or greater than 13.

5. The probe as recited in claim 4, wherein the second thickness divided by the first thickness is greater than or equal to 0.4.

6. The probe as recited in claim 5, wherein the unsupported length of the cantilevered portion divided by the height of the contact portion is between 25 and 100.

7. The probe as recited in claim 6, wherein the unsupported base portion has a thickness, and the thickness of the unsupported base portion divided by the first thickness of the cantilevered portion is between 0.9 and 1.5.

8. The probe as recited in claim 7, wherein the tip comprises a cutting edge having a length and a width and four trapezoidal sides extending at an angle therefrom, wherein a ratio of the length to the width of the cutting edge is greater than 2:1.

9. The probe as recited in claim 8, wherein the tip comprises a surface alloy having a hardness of 9 or greater.

10. The probe as recited in claim 9, wherein the surface alloy comprises one of titanium nitride, titanium aluminum nitride and chromium oxide.

11. The probe as recited in claim 1, wherein, for an intermediate portion between third and fourth positions along the length of the cantilevered portion and defined as a portion in which the top surface is not connected to the unsupported base portion and the bottom surface is not connected to the contact portion, the intermediate portion of the cantilevered portion has a continuously decreasing thickness from the third position to the fourth position, the third position being closer to the unsupported base portion than the fourth position and the fourth position being closer to the contact portion than the third position.

12. The probe as recited in claim 11, wherein the top surface and the bottom surface are not parallel to each other.

13. The probe as recited in claim 11, wherein the first thickness is a distance between the top surface and the bottom surface at the first end and the second thickness is a distance between the top surface and the bottom surface at the second end.

14. A vertical probe card comprising:
    a carrier comprising a probe guide that extends therethrough; and a probe disposed in the probe guide and connected to provide an electrical path between a device under test and a test controller, the probe comprising:
an unsupported base portion at least partially disposed in the probe guide;
a contact portion that includes a tip; and
a cantilevered portion that extends between the unsupported base portion and the contact portion and is connected to the unsupported base portion and to the contact portion, the cantilevered portion having a first end, a second end opposite the first end, a top surface that extends from the first end to second end, and a bottom surface that extends from the first end to the second end, the bottom surface being opposite the top surface and the top surface defining a length of the cantilevered portion;
wherein the unsupported base portion has a lower end that is connected to a portion of the top surface of the cantilevered portion and an upper end opposite the lower end, the unsupported base portion extending away from the top surface of the cantilevered portion so that the upper end of the unsupported base portion is located at a first height, and the lower end is connected to the portion of the top surface at a first position along the length of the cantilevered portion, the first position being adjacent the first end;
wherein the contact portion has an upper end opposite the tip, and the upper end of the contact portion is connected to a portion of the bottom surface of the cantilevered portion at a second position along the length of the cantilevered portion, the second position being adjacent the second end; and
wherein the cantilevered portion has a first thickness at the first end and a second thickness at the second end, the second thickness being less than the first thickness, and wherein a first distance between the first height and the bottom surface when measured at the first position is greater than a second distance between the first height and the bottom surface when measured at the second position.

15. The vertical probe card as recited in claim 14, wherein the second thickness divided by the first thickness has a value between 0.4 and 0.7.

16. The vertical probe card as recited in claim 15, wherein the tip includes a surface alloy comprising one of titanium nitride, titanium aluminum nitride, and chromium nitride.

17. The vertical probe card as recited in claim 16, wherein the tip comprises a cutting surface having a length and a width and four tapering, trapezoidal sides, wherein the length of the cutting edge is at least twice the width of the cutting edge.

* * * * *